United States Patent [19]
Ghia et al.

[11] Patent Number: 5,940,606
[45] Date of Patent: Aug. 17, 1999

[54] DUTY CYCLE CONTROLLER FOR CLOCK SIGNAL TO SYNCHRONOUS SRAM ON FPGA

[75] Inventors: Atul V. Ghia, San Jose; Suresh M. Menon, Sunnyvale, both of Calif.

[73] Assignee: DynaChip Corporation, Sunnyvale, Calif.

[21] Appl. No.: 09/020,622

[22] Filed: Feb. 9, 1998

[51] Int. Cl.$^6$ ....................................................... G06F 1/04
[52] U.S. Cl. ........................... 395/555; 395/559; 711/100
[58] Field of Search ..................... 395/551, 552, 395/555, 558, 559; 711/100; 327/173, 174, 175

[56] References Cited

U.S. PATENT DOCUMENTS

| | | | |
|---|---|---|---|
| 5,416,744 | 5/1995 | Flannagan et al. | 365/203 |
| 5,650,971 | 7/1997 | Longway et al. | 365/207 |
| 5,754,838 | 5/1998 | Shibata et al. | 395/559 |

*Primary Examiner*—Dennis M. Butler
*Attorney, Agent, or Firm*—Ronald Craig Fish; Falk & Fish LLP

[57] ABSTRACT

A duty cycle controller for generating proper control signals for an SRAM in an FPGA in the proper sequence and spaced at the proper times to guarantee proper operation of the SRAM regardless of the frequency of duty cycle of the clock selected by the user to synchronize and drive operations of the SRAM.

7 Claims, 4 Drawing Sheets

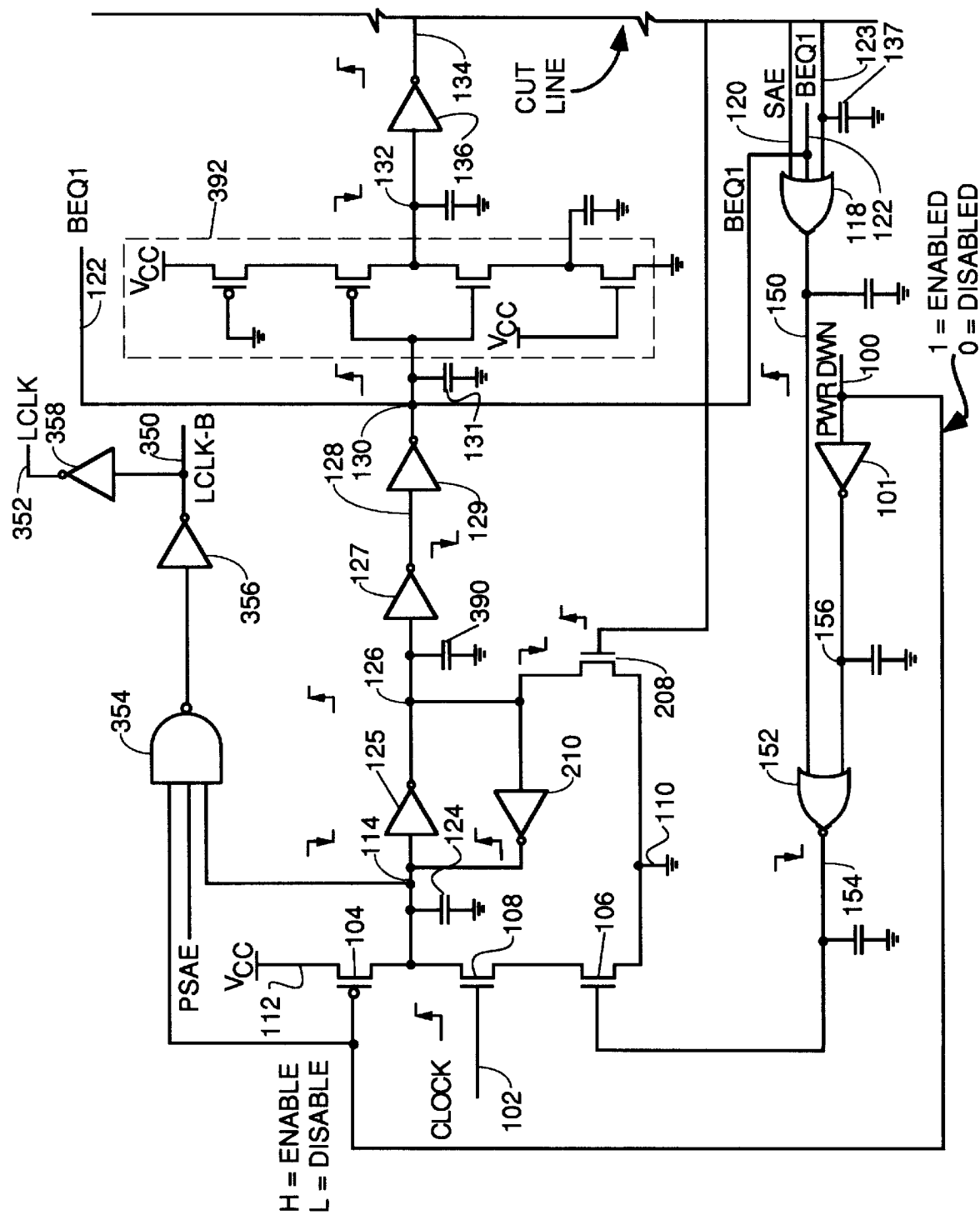

DUTY CYCLE CONTROLLER FOR CLOCK SIGNAL TO SYNCHRONOUS SRAM ON FPGA

FIELD OF USE

The invention finds use in the field of Field Programmable Gate Arrays (hereafter FPGAs), and, more particularly, in the field of implementation of synchronous SRAM FIFOs therein.

In FPGAs, it is desirable to have memory that can be used to implement FIFOs in addition to having logic blocks. Many FPGAs however have numerous clocks spread throughout the chip. In the FPGAs supplied by the assignee of the invention, there are eight quadrant clock external pins located in four different quadrants of the chip and two global clocks. The user can supply clock signals at the quadrant clock pins. There are also two internal PLLs generating internal clock signals and there are also global clock signals. The quadarant clock signals and the global clock signals from one side of the chip feed the inputs of one multiplexer under user control to select which clock signal is applied to the logic blocks on that side of the chip. The quadarant clock signals and the global clock signals from the other side of the chip feed the inputs of a second multiplexer under user control to select which clock signal is applied to the logic blocks on the other side of the chip. This structure is called the clock tree, and the complex structure means that the path length that the selected clock takes to any particular logic block is not known in advance and is selected by the routing software based upon user definition of the desired functionality.

The logic FPGAs also contain dual port synchronous SRAM cells which can be configured for dual port operation to use as a FIFO. However, this memory is configured, to operate it successfully requires that there be fixed access time and fixed set up and hold times for the address and data lines so that consistent, successful read and write operations can be performed.

The difficulty in accomplishing this arises because of unpredictable nature of the clock signal which is supplied. The user may elect to route the clock signals to the memory from any one of the quadrant clock pins or to use either one of the two global clock signals. Further, the routing that is selected for the clock lines by the software that programs the various bits to define the functionality of the FPGA is not predictable. Likewise, the routing for the data and address lines is picked by the software, and is not predictable or known in advance. Therefore, the propagation delays in the clock signals are unpredictable which affects rise times and fall times of the clock signals and causes further uncertainty in the duty cycle of the clock over and above the uncertainty in the duty cycle caused by the fact that the user is generating the clock signal in some cases. This uncertainty in the duty cycle can cause problems in the memory operation since successful operation of the memory requires that certain fixed relationships in set up and hold times for address and data lines, as established by the duty cycle of the selected clock cycle be strictly observed.

On the FPGAs supplied by the assignee of this invention, there are ten different sources of clock signal, some of which are external clocks supplied by the user via a pin. The user can supply any frequency and any duty cycle, and what will be supplied is not known in advance if one of the user supplied clocks is routed to the SRAM. Synchronous SRAMs write data into a cell or read data out of a cell at a clock edge after a predetermined set up and hold time has been established to stabilize the address lines. With synchronous SRAMs, it is necessary to have a known, dependable duty cycle to prevent random reads from occurring. The main problem in FPGAs with variable routing from one application to the next and with external clock signals being supplied is that there is no guarantee as to the duty cycle of the clock, and that can cause problems with the setup and hold times needed for proper memory operation.

Therefore, a need has arisen for a circuit that can adjust for these propagation delays and vagaries in clock duty cycle so that successful memory operation can occur regardless of the routing selected for various address, data and clock lines selected by the routing software and unknown variations in clock duty cycles.

SUMMARY OF THE INVENTION

The invention is a duty cycle controller which eliminates the aforementioned problems in FPGA memory operations. The basic idea employed by the duty cycle controller of the invention is to ignore the duty cycle of the clock supplied by the user and generate a synthesized duty cycle. This is done by generating a synchronous signal which has a proper duration at logic 1 to guarantee that the input latches on the address lines, the write enable line and the data lines stay transparent for the right amount of time before the clock transitions to logical and transfers the inputs internally. The duty cycle controller of the invention then holds the data internally for a proper hold time for the address decoder to decode the address and raise the proper word line and holds the data on the bit line long enough to write the data into the cell in the case of a write cycle. The duty cycle controller of the invention senses only the rising edge of a user supplied or other clock pulse in the clock signal supplied by the SRAM, and uses that rising edge to trigger generation of the signal which is used to control the latches for the address, data and write enable signals. In the preferred embodiment, the signal generated by the duty cycle controller also clears itself and resets the master latches to a transparent state again in time to sense new address, data and the write enable signal needed for the next cycle, and clears the sense amplifier latch to transparent mode again in time for the next cycle. Any circuit that performs at least these functions will suffice to practice the invention.

BRIEF DESCRIPTION OF THE DRAWINGS

FIGS. 2A and 2B, taken together, comprise a schematic diagram of the preferred embodiment of a species of duty cycle controller within the genus of the invention.

DETAILED DESCRIPTION OF THE PREFERRED AND ALTERNATIVE EMBODIMENTS

Figure 1:
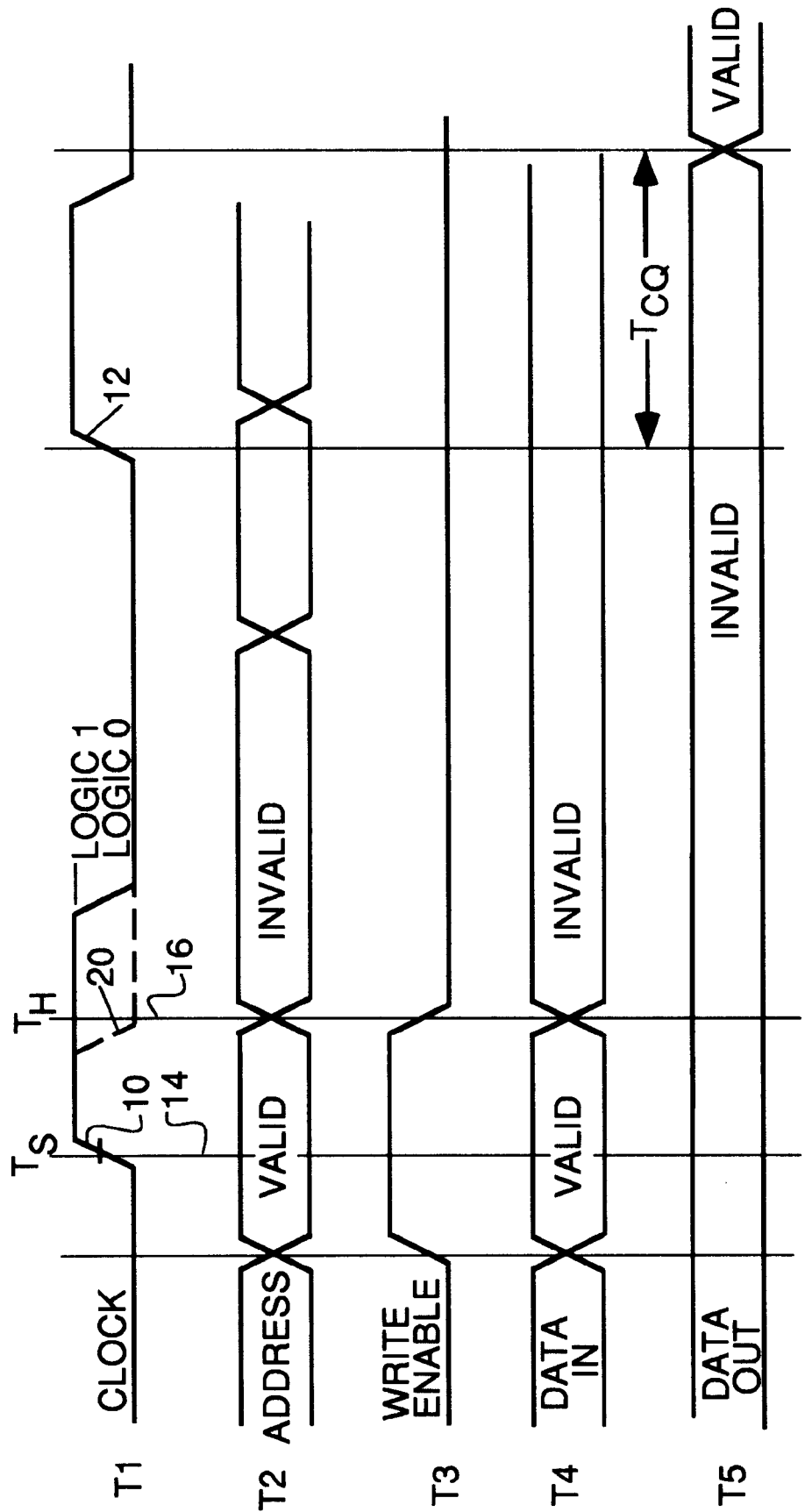
FIG. 1 is a timing diagram illustrating the setup and hold time requirements of synchronous memory operations.

Referring to FIG. 1, there is shown a timing diagram illustrating the setup and hold time requirements of synchronous memory operations. Timeline T1 illustrates the clock pulse train. In some species of synchronous memory, it is the rising edge of the clock pulses which are used to measure times. In other species, it is falling edges that are used. For purposes of illustrating the teachings of the invention, this is not critical and the rising edges will be used in the example of the invention given herein. Rising edge 10 marks the end of the setup time for the address signals illustrated on time line T2, the write enable signal on time line T3 and the data in signal on time line T4. Any signal line on any of the write enable, data or address buses which changes states after the end of the setup time cannot be guaranteed to be latched in a correct state into the latches of the memory for the address decoder and data buffer. The information that exists at the end of the setup time is the information upon which the memory will be operated for this read or write cycle. This is best understood by thinking of the internal latch that receives the address bits as an input switch which connects the address lines to the lines which carry the address bits to the decoder. For this illustration, we will call the switch at the input of the latch as the input switch. At the midpoint of rising clock edge 10, the input switch closes and whatever information that has been stored in the latch gets transferred to the decoder where it is decoded and the appropriate word line is raised to logic 1. Because the input switch has opened, no changes on any address bit line can get to the decoder after rising edge 10.

There is also a minimum required hold time which is defined as the minimum amount of time that the address inputs to the decoder in the SRAM must be held steady at the values that existed at rising edge 10. This is the minimum amount of time it takes the decoder to decode the address bits and raise the appropriate word line in the SRAM to logic 1. This hold time is illustrated in FIG. 1 as the interval between the vertical lines $T_S$ shown at 14 and $T_H$ shown at 16.

The duty cycle of the clock signal is the percentage of time the clock signal is at the logic 1 level on time line T1 as a fraction of the total time of one cycle.

The duty cycle is critical to proper operation of the SRAM, and must be guaranteed to be at least a certain percentage of the period to gurantee that no invalid address bits get to the decoder before the decoder has fully decoded the correct address. The clock signal to the SRAM can be supplied by the user, so it is possible for the user to supply a clock signal with an inadequate duty cycle. The problem this causes stems from the fact that the input switch of the latch only stays open only while the clock is at logic 1. Suppose that the clock signal supplied by the user has a duty cycle illustrated by the dashed line 20 such that the clock signal goes to logic one at the time of rising edge 10 but goes back down to logic 0 at the time of falling edge 20. This will open the input switch at the time of falling edge 20 before the minimum hold time has expired and before the decoder has finished decoding the address bits which existed at the time of rising edge 10. Note that at time 16, the bits on the address lines may make a transition to an invalid address, i.e., an address which is not the address that existed at time 14 from which the user desires to read data from or to which the user desires to write data. With the input switch closed, the invalid address bits cannot get through to the decoder before it has finished decoding the correct address and cause havoc in the decoder possibly causing the wrong memory cell to be read or written. Therefore, to make the memory operation reliable, it is necessary to be able to eliminate vagaries in the duty cycle of the clock from operation of the memory. Different propagation times for different path lengths selected for the clock signal have different effects on the rise and fall times of the clock signal, and these variations cause additional uncertainty in the duty cycle which must also be dealt with to provide for reliable synchronous SRAM operation in an FPGA.

Rising edge 12 on the next clock pulse marks the beginning of the access time for a read cycle. Some time $T_{cq}$ later, the data out lines represented by time line T5 will transition to their valid state. Although, the example given above speaks of data lines in the plural sense, the actual memories in many FPGAs are only a single bit per cell so there is only one data line in and one data line out.

The invention allows the user to supply a clock signal of any duty cycle to the SRAM of the FPGA, and the FPGA duty cycle controller will use the rising edge of the clock and generate a signal for use by the SRAM that a proper duration at logic 1 for holding out any changes on the address lines from reaching the address decoder. Another innovate feature is the ability to shut off the clock to any logic block SRAM not programmed to be in use. This prevents the SRAM not being used in any logic block from using any power.

Figure 2B:
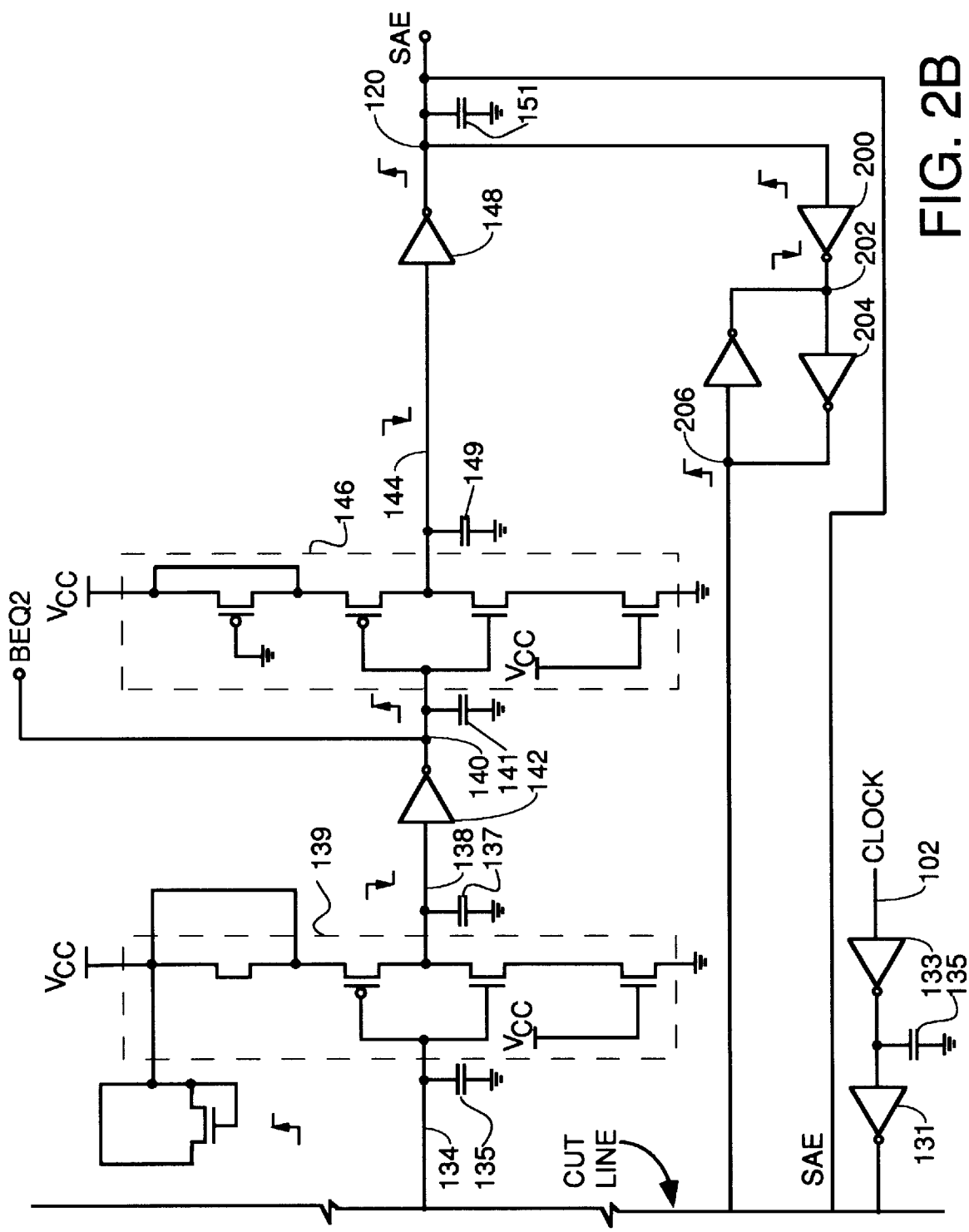

Referring to FIGS. 2A and 2B, which are the only two pieces of a mosaic which, when assembled together at the cut line, comprise a schematic diagram of the preferred embodiment of the duty cycle controller of the invention. One of the unique aspects of the clock duty cycle controller of FIGS. 2A and 2B is that by assertion and deassertion of a PWR DWN signal on line 100, the duty cycle controller can be enabled and disabled. When the duty cycle controller is disabled, the clock signal on line 102 whose duty cycle is to be regulated is blocked and does not reach the SRAM thereby preventing any switching of the CMOS circuitry of the duty cycle controller or the SRAM and conserving power. When the PWR DWN signal on line 100 is high, the duty cycle controller is enabled because PMOS device 104 is off and NMOS device 106 is on thereby connecting the source of input NMOS device 108 to ground 110. Conversely, when PWR DWN is a logic 0, PMOS device 104 is turned on thereby connecting Vcc source 112 to node 114 thereby keeping it in a logic 1 state. The transitions of the clock on line 102 cannot affect the voltage on node 114 because the source of the NMOS transistor 108 is decoupled from ground by virtue of NMOS device 106 being off.

In FIG. 2A, there are three clocks applied to the input of OR gate 118. The SAE and BEQ1 clock signals on lines 120 and 122 are clock signals needed for precharging and strobing the sense amplifier and bit lines. Line 123 carries a twice inverted clock signal CLOCK from line 102 (the same clock signal which is supplied by the user or from another source and which is applied to the gate of NMOS device 108). Two inverters 131 and 133 and capacitors 135 and 137 cause the version of the CLOCK signal that reaches the input of OR gate 118 to be slightly delayed from the version that reaches the gate of NMOS device 108.

Initially, when the circuit powers up everything is disabled, and node 100 is logic 0. Hereafter, logic 0 is referred to as the low state and logic 1 is referred to as the high state. We also assume the clock signal on line 102 to be initially low. The initial low at node 100 turns on PMOS device 104 and connects Vcc source 112 to node 114 thereby charging up capacitor 124 and causing an initial high on node 114. The initial high on node 114 causes an initial low on node 126 because of inverter 125. The initial low on node 126 causes an initial high on node 128 because of inverter 127, and this causes an initial low on node 130 because of inverter 129. The signal on node 130 is the BEQ1 signal. When this BEQ1 signal is low, the bit lines and data lines in the SRAM are being precharged.

The initial low on node 130 causes an initial high on node 132 because the circuit 134 inside the dashed line acts as an inverter. The use of the structure of 134 for an inverter is preferred because it allows rise time/fall time of both the rising edge and the falling edge to be controlled to lengthen the pulse on node 132 thereby eliminating the need for additional circuitry. The same is true of the inverter structures 139 and 146. Standard inverter structures would also work.

The initial high on node 132 causes an initial low on node 134 because of inverter 136. The initial low on node 134 causes an initial high on node 138 because the circuit 139 acts as an inverter. The initial high on node 138 causes an initial low on node 140 because of the action of inverter 142, and this causes an initial high on node 144 because of the inversion action of the circuit 146. The initial high on node 144 causes inverter 148 to drive output node 120 from which the SAE signal is taken to an initial low.

The SAE signal at node 120 is fed back to an input of OR gate 118 on FIG. 2A so that input is initially low. Likewise, the BEQ1 signal on node 130 is fed back to another input of OR gate 118, so that input is initially low. Finally, the CLOCK signal on line 102 is initially low, so, after two inversions in inverters 131 and 133, the third input 123 of OR gate 118 is low. Thus, node 150 at the output of OR gate 118 is initially low, and the initial state for the PWR DWN signal on line 100 is low to disable the circuit. When PWR DWN is low, this causes node 156 to be high because of inverter 101. When node 156 is high, NOR gate 152 blocks all clock transitions on line 150 from getting through it. This is the initial setup state.

To arm the circuit to start generating the proper duty cycle pulse on a rising clock edge, the PWR DWN signal is raised to logic 1. This causes PMOS transistor 104 to turn off. Raising PWR DWN to logic 1 lowers node 156 to logic 0 thereby causing NOR gate 152 to gate all transitions on node 150 through in inverted form to node 154. The initial low on node 150 is then converted to an initial high on node 154 when the PWR DWN signal is raised to logic 1. This turns on NMOS device 106 thereby creating a discharge path from node 114 to ground through NMOS device 108 at the next rising clock edge of the CLOCK signal on line 102. Raising PWR DWN to logic 1 arms the circuit so that the next rising clock edge of the CLOCK signal on line 102 will cause a pulse of the proper pulse width to be formed from which the derivative clocks can be generated.

Now that PWR DWN has been raised to logic 1, the system is ready to operate to generate the appropriate pulse width signal to operate the SRAM in the FPGA. At the next rising clock edge of the CLOCK signal on line 102 (regardless of its duty cycle), NMOS device 108 is turned on and node 114 is discharged to a logic 0 state so it makes a high-to-low transition. This causes node 126 to make a low-to-high transition after one inverter delay. The low-to-high transition on node 126 causes a high-to-low transition on node 128 after another inverter delay. The high-to-low transition on node 128 causes a low-to-high transition on node 130 thereby terminating the precharge process.

The low-to-high transition on node 130 causes a high-to-low transition on node 132 after a one inverter delay caused by inverter 134. This causes a low-to-high transition on node 134 after another inverter delay caused by inverter 136. The low-to-high transition on node 134 causes a high-to-low transition on node 138 after another inverter delay caused by inverter 139. The high-to-low transition on node 138 causes a low-to-high transition on node 140 after another inverter delay caused by inverter 142. This low-to-high transition on node 140 is the BEQ2 signal, and terminates the precharge process of the SRAM data lines. After two more inverter delays caused by inverters 146 and 148, node 120, i.e., the SAE signal, makes a low-to-high transition thereby latching the output of the sense amplifier.

The process of resetting the charge states of the initial nodes 114 and 126 occurs as follows. The low-to-high transition on node 120 causes inverter 200 to drive node 202 on FIG. 2B from high-to-low. This causes inverter 204 to drive node 206 from low-to-high, and this, in turn, causes NMOS device 208 to drive node 126 back from the high state to the low state after a total of three inverter delays from the low-to-high transition of the SAE signal on line 120. This high-to-low transition on node 126 caused by NMOS device 208 causes inverter 210 to drive node 114 back from the low state to the high state after another inverter delay thereby completing the reset process and preparing the duty cycle controller to receive and react to the next rising clock edge. Any rising clock edges that occurred before node 114 is reset are ignored.

What happens if the clock signal on line 102 stays high for a long time and is still high when inverter 210 tries to force the low-to-high reset transition on node 114. If the CLOCK signal on line 102 were still high, absent some other mechanism to screen its effect, the high on line 102 would have NMOS device 108 turned on which would cause node 114 to be grounded through NMOS devices 108 and 106. The solution to this problem is to cut off the discharge path to ground through node 106 a short time after the clock pulse 102 made the low-to-high transition. This happens because the initial low-to-high transition of CLOCK causes a low-to-high transition of the BEQ1 signal 4 inverter delays later. This low-to-high transition of BEQ1 is coupled to one input of OR gate 118 which causes a low-to-high transition at the input of NOR gate 152. NOR gate 152 acts to invert the low-to-high transition on line 150 thereby driving line 154 high-to-low and turning off NMOS device 106 in the discharge path. This floats node 114 such that the low-to-high transition forced by inverter 210 charges capacitor 124 to the logic 1 state to complete the resetting process.

Figure 3:
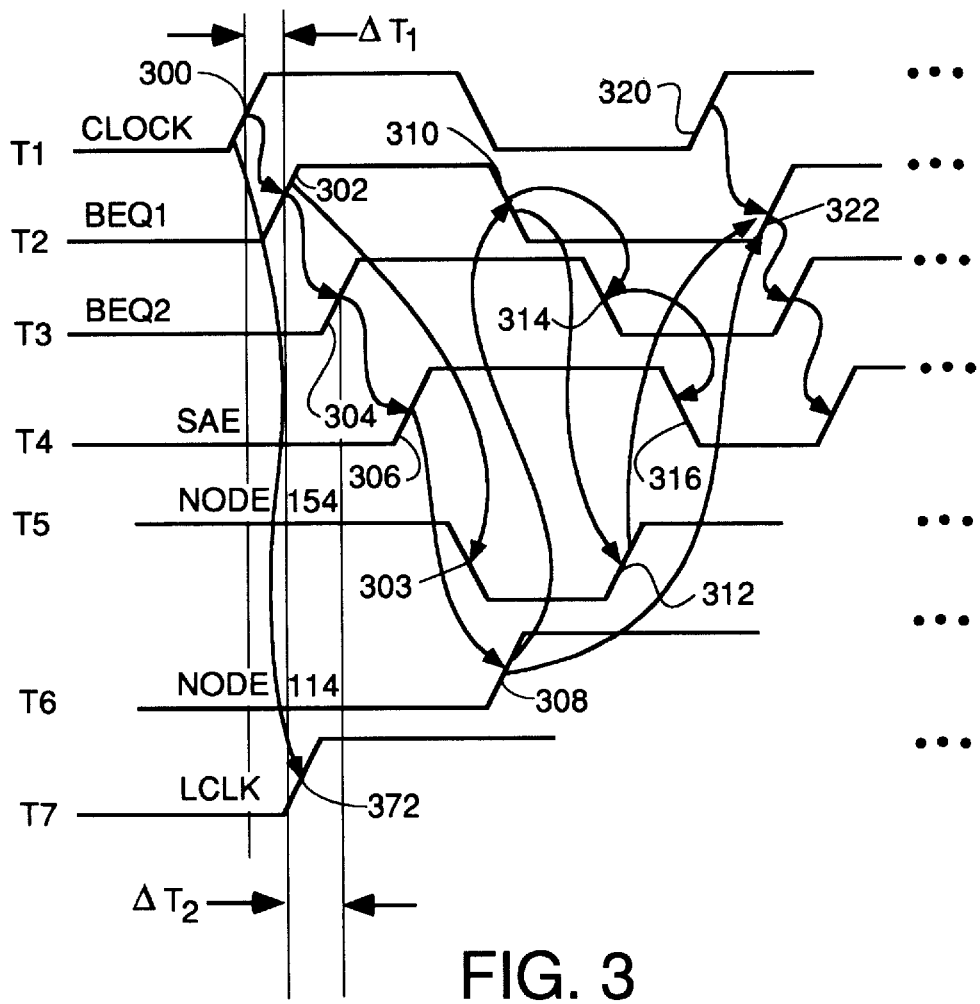
FIG. 3 is a timing diagram of the sequence and and interactions of the control signals generated by all duty cycle controllers within the genus of the invention.

The network of inverters shown in FIGS. 2A and 2B establish a sequence of releases of the precharge state as shown in the timing diagram of FIG. 3. Basically, the sequence of events is: the low-to-high transition 300 of CLOCK on time line T1 causes a low-to-high transition 302 of BEQ1 on time line T2 approximately 2.7 nanoseconds later. The low-to-high transition 302 of BEQ1 stops the precharge of the bit lines and stops the precharge of the data lines, and causes a low-to-high transition 304 of BEQ2 at some interval later to stop the precharge of the sense amplifier output nodes. The delay between the low-to-high transitions 302 and 304 of BEQ1 and BEQ2 is set based upon the size and driving ability of the cells in the array and the amount of time needed for the cells to drive the bit lines to a sufficient voltage differential, i.e., voltage swing, that is adequate for the sense amplifier to sense. Larger arrays have more parasitic capacitance on the bit lines and require longer delays to drive the bit lines to adequate swing for the data to be sensed. The low-to-high transition 302 also cause a high to low transition 303 on node 154 to cut off the discharge path of node 114 to ground. The transition 304 of BEQ2 causes a low-to-high transition 306 of the SAE signal on time line T4 which latches the output of the sense amplifier. This transition 306 causes a low-to-high transition on node 114 some time later. The low-to-high transition on node 114 causes the high-to-low transition 310 of the BEQ1 signal thereby restarting the precharge process for the bit lines and the data lines for the next cycle. This transition 310 cause both a low-to-high transition 312 some time later on node 154 shown on time line T5 and also cause some time later a high-to-low transition 314 of the BEQ2 signal thereby restarting the process of precharging the output node of the sense amplifier and the data lines from the sense amplifier to the input of the output latches for the next cycle. The high-to-low transition 314 of BEQ2 then causes, some time later, a high-to-low transition 316 of the SAE signal thereby enabling the output latches to be put into a state to latch the output data on the next cycle. The low-to-high transition 308 of node 114 coupled with the low-to-high transition 312 of node 154 (caused by the high-to-low transition 310 of BEQ1), sets up node 114 and the BEQ1 signal on node 130 to react to the next rising edge of CLOCK. This delay is set based upon the desire memory cycle time and clock rate. This reaction of BEQ1 to the rising edge 320 of CLOCK is shown as low-to-high transition 322 of BEQ1 on time line T2. The cycle then repeats itself.

Figure 4:
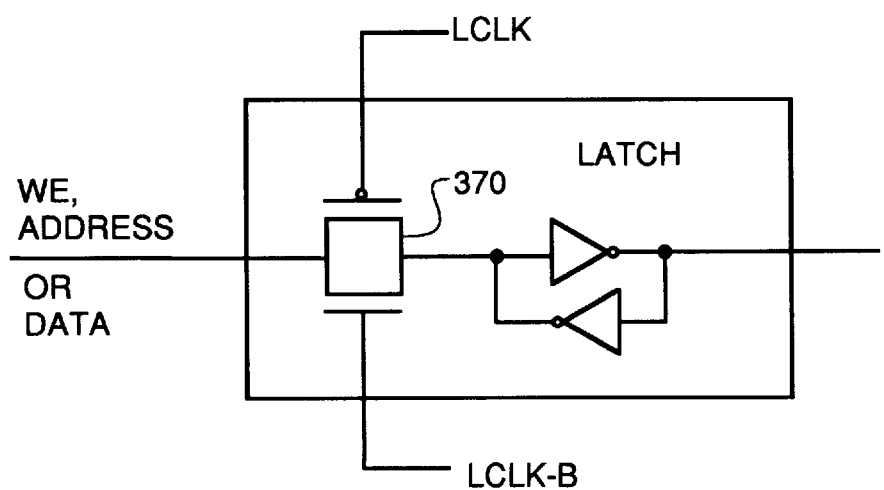
FIG. 4 is a symbolic schematic diagram of an input latch within the SRAM being controlled to illustrate the transparent mode.

Transparency of the input latches (not shown) for address, data and write enable signals is controlled by the signals LCLK-B and LCLK on lines 350 and 352 in FIG. 2A. Basically, the input latches are transparent during the time when CLOCK is low and input node 114 is at a logic 1. However, when CLOCK makes a low-to-high transition which drives node 114 from high-to-low, NAND gate 354 and inverters 356 and 358 generate the signals LCLK-B and LCLK on lines 350 and 352 so as to render the input latches no longer transparent. This locks out any further invalid changes on the address, data or write enable lines. Although the changing from transparency to non-transparency occurs a short time after the low-to-high transition of CLOCK, it does not need to and this is simply an inherent delay caused by the logic needed to generate the LCLK signal and its inverse. FIG. 4 illustrates the pass gate structure of the latches for the WRITE ENABLE, ADDRESS and DATA inputs to the SRAM. Pass gate 370, comprised of a PMOS device and an NMOS device, implements the transparency function. The signal LCLK on line 352 of FIG. 2A is coupled to the gate of the PMOS device and the inverse signal LCLK-B is coupled to the gate of the NMOS device. When CLOCK on line 102 is low, LCLK is low and LCLK-B is high. This is the transparent state when both transistors in the pass gate are turned on. When a rising edge of CLOCK on line 102 occurs at a time when node 114 is armed, LCLK goes high and LCLK-B goes low in response to the high-to-low transition on node 114 in FIG. 2A. This causes the pass gate transistors to both be turned off thereby preventing any invalid transitions on the ADDRESS, DATA or WRITE ENABLE signal lines from getting into the latch. The cause and effect relationship between the low-to-high transistion 300 of CLOCK and the low-to-high transition 372 of LCLK is shown on time line T7 of FIG. 3.

The sequence of events shown in FIG. 3 define the genus of the invention. Any circuitry which can cause this sequence of events between CLOCK, LCLK, BEQ1, BEQ2, SAE and cut off the discharge path to a node like node 114 so that it can be reset to armed state regardless of what CLOCK is doing will be species within the teachings of the invention. It may be a programmable machine, a state machine, or any Boolean logic array or any other circuit to establish this sequence of events. Any such circuit that can establish the sequence of events will have the utility needed to be a species within the genus of the duty cycle controller invention. The exact timing relationships or delays between each of the transitions shown in FIG. 3 are not critical to the invention, and is tailored to the physical and electrical characteristics of the individual SRAM or other memory being controlled in terms of the functional considerations outlined above for the timing between cessation of the various precharge cycles. Likewise, the resetting process and blocking of the clock for interfering with the resetting process is tailored for different clock speeds and different desired memory cycle access times. In other words, the particular details of the actual delays for any specific implementation of the invention are not critical to the invention since they are peculiar to that particular SRAM configuration, so long as the functional considerations detailed above are met.

In the claims, the "first node" is intended to means node 114 and the "first means" is intended to mean PMOS device 104 and the PWR DWN signal or functional equivalents thereof. The term functional equivalent is not intended to mean equivalent in the sense of a classic doctrine of equivalents analysis but simply to mean any circuit that provides the same delay.

The "electronically controlled switch" is intended to mean NMOS device 108 with its source tied directly to ground to cover embodiments where restrictions on the frequency and/or duty cycle of the clock siganl on line 102 that prevent it from ever driving the gate of device 108 to logic 1 when the reset transition output by inverter 210 happens.

In a more useful embodiment where no such restrictions need be imposed on the clock, as claimed in claim 2, the electronically controlled switch is coupled to ground by a "second electronically controlled switch" meaning device 106 coupling the source of device 108 to ground 110 and functional equivalents. Claim 2 is not intended to cover the driver circuitry which provides the control signal at node 154 which controls the conductive state of device 106. Claim 3 is intended to cover that driver circuitry by the phrase "driver means" meaning circuitry such as NOR gate 152 and OR gate 118 and all their input signals (and functional equivalents) except the PWR DWN input, the driver means for selectively turning transistor 106 on and off to provide for a discharge path to ground for node 114 when a rising edge (or falling edge) is to be sensed, but which blocks the discharge path when clock edges are to be ignored or in the situation where the clock remains high when the reset transition on the output of inverter 210 occurs. In this latter situation, the discharge path is opened at some time after the rising edge of CLOCK which started the cycle but before the reset transition from low-to-high is output by inverter 210. This opening of the discharge path prevents the logic one state of CLOCK from keeping device 108 turned on thereby adversely affecting the charge state of node 114. Claim 3 is intended to cover device 106 and its driver circuitry but not the PWR DWN signal (that circuitry is covered in claim 4) plus functional equivalents of any part of this combination or the entire combination. The term functional equivalent is not intended to mean equivalent in the sense of a classic doctrine of equivalents analysis but simply to mean any circuit that provides the same function and same delay between the occurrences of the transitions of BEQ1 and SAE and the comcomitant transitions they cause on node 154. The "power down means" of claim 4 is intended to cover PMOS device 104, inverter 101 and the PWR DWN signal operating together with NOR gate 152 to shut off the discharge path through transistor 106 and to force node 114 to a logic 1 state to disable the duty cycle controller when the PWR DWN signal is in a disable state.

The "first delay circuit" is intended to mean inverters 125, 127 and 129 and capacitors 129 and 131 or functional equivalents thereof which provide the same delay. In other words, any circuit that provides the right amount of delay will be deemed equivalent. The amount of delay needed from the "first delay circuit" is minimum amount needed for the DATA, ADDRESS and WRITE ENABLE signals to be reliably latched after the latch is made not transparent and for the lines carrying these bits to settle and for the address decoder to work and activate the proper word line to address the cell being addressed (and for the proper bit lines to be selected in the case of an SRAM with multiple columns. In other words, the "first delay circuit" must provide as a minimum sufficient delay after the clock edge that starts the cycle such that the input latches have been made not transparent and the the proper word line has been activated and the precharge of the bit lines and data output lines from the Y multiplexer to the sense amplifier has been completed—when all those events have happened, the precharging of the bit lines and the precharging of the data lines from the output of the Y multiplexer to the input of the sense amplifier can be stopped. Accordingly, the output from the "first delay circuit" is a signal that terminates the precharge of the bit lines and terminates the precharge of the data lines.

As used in the claims, the phrase "second delay circuit" means inverters 134, 136, 139 and 142 and capacitors 135, 137 and 141 or functional equivalents that provide the same delay. The term functional equivalent is not intended to mean equivalent in the sense of a classic doctrine of equivalents analysis but simply to mean any circuit that provides the same delay. The output of the "second delay circuit" is the BEQ2 signal which, when it transitions from low-to-high, terminates the precharge of the output node of the sense amplifier and the data lines that run from that output node to the input of the sense amplifier. The minimum amount of delay provided by the "second delay circuit" must be sufficient so that after the bit lines and data lines have been released from precharging, the memory cell being read has had enough time to drive the selected bit lines and the data lines running from the output of the Y multiplexer to the input of the sense amplifier to a high enough voltage differential or swing for the sense amplifier to sense the bit stored in the cell. When this has happened, the "second delay circuit" "activates" (in this case activation means forcing a low-to-high transition) the BEQ2 signal thereby releasing from the precharge cycle the output node(s) of the sense amplifier and the data line(s) that run from the output of the sense amplifier to the input of the data latch.

As used in the claims, the phrase "third delay circuit" means inverters 146 and 148 and capacitors 149 and 151 and functional equivalents. The term functional equivalent is not intended to mean equivalent in the sense of a classic doctrine of equivalents analysis but simply to mean any circuit that provides the same delay. The minimum delay the third delay circuit needs to impose is an interval following release of the output node(s) of the sense amplifier from the precharge cycle that is sufficient to allow the sense amplifier to sense the voltage differential on the data lines from the Y multiplexer and drive signals onto the data lines from the output node of the sense amplifier to the input of the output data latches to a sufficiently high level which is sufficiently stable to be correctly latched into the data output latch by the low-to-high transition of the SAE signal.

As used in the claims, the "fourth delay circuit" means inverters 200, 204, 210 and NMOS device 208 and functional equivalents. The term functional equivalent is not intended to mean equivalent in the sense of a classic doctrine of equivalents analysis but simply to mean any circuit that provides the same delay. The function of the fourth delay circuit is to convert the transition of the SAE signal from low-to-high into a resetting of the first node 114 to a logic 1 level a short time later. The minimum time delay this "fourth delay circuit" needs to impose between the low-to-high transition of SAE to the resetting of node 114 is established by the desired interval for the memory access cycle and the clock rate on line 102. Normally, the memory cycle is one full period of the clock. If one full period is to be used, then node 114 needs to be reset in sufficient time after the first rising clock edge to prepare node 114 to react to the next rising clock edge of CLOCK on line 102.

The term "delay elements" in the claims means any circuit that can provide a predictable amount of delay. As can be seen from the above discussion, a certain amount of delay is needed between each event in the sequence of events needed to operate the SRAM. To make the SRAM as fast as possible, those delays should be the minimum required to satisfy the operational needs of the SRAM and optimize its performance. For example, if more delay is imposed than is necessary between transition on the first node thereby causing the input latches to go nontransparent and the time the the bit lines are fully precharged and the precharging is stopped, the RAM will still work, but it will be slower than is optimal. The claims are intended to cover all embodiments of delays from the minimum needed to delays that are greater than the minimum needed but the SRAM still works.

Although the invention has been disclosed in terms of the preferred and alternative embodiments disclosed herein, those skilled in the art will appreciate possible alternative embodiments and other modifications to the teachings disclosed herein which do not depart from the spirit and scope of the invention. All such alternative embodiments and other modifications are intended to be included within the scope of the claims appended hereto.

What is claimed is:

1. A duty cycle controller for a memory, said memory having input latches for storing address bits, at least one input data bit and a write enable bit, said input latches having a transparent mode and a nontransparent mode, and having bit lines, a Y multiplexer having inputs coupled to said bit lines and an output, at least one sense amplifier, data lines from the output of said Y multiplexer to the input of said sense amplifier, and an output node of said sense amplifier coupled to the input of a data output latch, said duty cycle controller for generating control signals needed to control said memory in the proper sequence and with the proper timing to correctly operate the memory regardless of the duty cycle of a clock that defines the memory access cycles, comprising:

a first conductor providing a source of Vcc voltage;

a ground conductor;

a first node coupled to said ground conductor through a capacitor;

first means coupled to said first node for initially charging said first node to a logic one state in a disable state by coupling said first node to said first conductor, and then, in an enable state, disconnecting said first node from said first conductor;

an electronically controlled switch having first and second terminals and having a control terminal coupled to receive a clock signal, said first terminal coupled to said first node and said second terminal coupled to said ground conductor, said clock signal controlling whether a conductive path exists between said first and second terminals for pulling said first node to a logic zero state when a predetermined transition of said clock signal is received at said control terminal;

a first delay circuit having one or more delay elements therein and having said first node as an input and having as an output a second node from which a BEQ1 bit line and data line precharge signal is taken, said first delay circuit functioning to convert the high-to-low transition on said first node to a low-to-high transistion on said second node some predetermined time later, thereby terminating a precharge cycle of said bit lines and terminating the precharge cycle of said data lines from the output of said Y multiplexer to said sense amplifier;

a second delay circuit having one or more delay elements therein and having said second node as an input and having a third node as an output, said third node being a node from which a BEQ2 sense amplifier data output line precharge signal is taken, said second delay circuit functioning to convert the low-to-high transition at said second node into a low-to-high transition at said third node some predetermined time later thereby terminating a precharge cycle of said data lines;

a third delay circuit having one or more delay element therein and having said third node as an input and having an SAE output node as an output, said third delay circuit functioning to convert the low-to-high transition on said third node to a low-to-high transition on said SAE output node a predetermined time later thereby latching an output signal from said sense amplifier in said data output latch; and a fourth delay circuit having said SAE output node as an input and having said first node as an output and having one or more delay elements, said fourth delay circuit for converting the low-to-high transition on said SAE output node to a low-to-high transition of said first node a predetermined time later to reset the first node to a logic one state thereby causing said input latches to go into transparent mode to start the setup time of said memory access cycle, and to initiate the process of restarting precharge cycles for said bit lines, said data lines and said output node of said sense amplifier to prepare for the next memory access cycle.

2. The apparatus of claim 1 a second electronically controlled switch having first and second terminals and a control terminal for receiving a control signal which controls whether said second electronically controlled switch is conductive or not conductive between said first and second terminals, said first and second terminals coupled between said first electronically controlled switch and said ground conductor for selectively providing or blocking a discharge path between said first node and said ground conductor, said blocking of said discharge path occurring at first predetermined times when the voltage of said clock signal is to be blocked from affecting the voltage on said first node, but for unblocking said discharge path when a clock edge is to be sensed and cause said duty cycle controller to generate said memory control signals at said second node, third node and said SAE output node.

3. The device of claim 2 further comprising driver means having an output coupled to said control terminal of said second electronically controlled switch, for selectively turning said second electronically controlled switch on when a transition of said clock signal is to be sensed, but for turning said second electronically controlled switch off when a voltage state or transition of said clock signal is to be ignored.

4. The device of claim 3 wherein said driver means further comprises power down means coupled to the control terminal of said second electronically controlled switch and to said first node, for receiving a power down signal having enable and disable binary states, and for controlling the voltage on said control terminal of said second electronically controlled switch and the voltage on said first node such that when said power down signal is in said disable binary state, said first node is forced to remain at a predetermined voltage and said second electronically controlled switch is rendered nonconductive between its first and second terminals such that said duty cycle controller is rendered inoperative regardless of any transitions of said clock signal, but for enabling said duty cycle controller to operate when said power down signal is in said enable state.

5. A duty cycle controller for a memory, said memory having input latches for storing address bits, at least one input data bit and a write enable bit, said input latches having a transparent mode and a nontransparent mode, and having bit lines, a Y multiplexer having inputs coupled to said bit lines and an output, at least one sense amplifier, data lines from the output of said Y multiplexer to the input of said sense amplifier, and an output node of said sense amplifier coupled to the input of a data output latch, said duty cycle controller for generating control signals needed to control said memory in the proper sequence and with the proper timing to correctly operate the memory regardless of the duty cycle of a clock that defines the memory access cycles, comprising:

a first conductor providing a source of Vcc voltage;

a ground conductor;

a first node coupled to said ground conductor through a capacitor;

first means coupled to said first node for initially charging said first node to a logic one state in a disable state by coupling said first node to said first conductor, and then, in an enable state, disconnecting said first node from said first conductor;

an electronically controlled switch having first and second terminals and having a control terminal coupled to receive a clock signal, said first terminal coupled to said first node and said second terminal coupled to said ground conductor, said clock signal controlling whether a conductive path exists between said first and second terminals for pulling said first node to a logic zero state when a predetermined transition of said clock signal is received at said control terminal;

a first delay circuit having one or more delay elements therein and having said first node as an input and having as an output a second node from which a BEQ1 bit line and data line precharge signal is taken, said first delay circuit functioning to convert the high-to-low transition on said first node to a low-to-high transistion on said second node some predetermined time later, thereby terminating a precharge cycle of said bit lines and terminating the precharge cycle of said data lines from the output of said Y multiplexer to said sense amplifier;

a second delay circuit having one or more delay elements therein and having said second node as an input and having a third node as an output, said third node being a node from which a BEQ2 sense amplifier data output line precharge signal is taken, said second delay circuit functioning to convert the low-to-high transition at said second node into a low-to-high transition at said third node some predetermined time later thereby terminating a precharge cycle of said data lines;

a third delay circuit having one or more delay element therein and having said third node as an input and having an SAE output node as an output, said third delay circuit functioning to convert the low-to-high transition on said third node to a low-to-high transition on said SAE output node a predetermined time later thereby latching an output signal from said sense amplifier in said data output latch; and a fourth delay circuit having said SAE output node as an input and having said first node as an output and having one or more delay elements, said fourth delay circuit for converting the low-to-high transition on said SAE output node to a low-to-high transition of said first node a predetermined time later to reset the first node to a logic one state thereby causing said input latches to go into transparent mode to start the setup time of said memory access cycle, and to initiate the process of restarting precharge cycles for said bit lines, said data lines and said output node of said sense amplifier to prepare for the next memory access cycle;

and further comprising a second electronically controlled switch having first and second terminals and a control terminal for receiving a control signal which controls whether said second electronically controlled switch is conductive or not conductive between said first and second terminals, said first and second terminals coupled between said second terminal of said first electronically controlled switch and said ground conductor, for selectively providing or blocking a discharge path between said first node and said ground conductor, said blocking of said discharge path occurring at first predetermined times when the voltage of said clock signal is to be blocked from affecting the voltage on said first node, but for unblocking said discharge path when a clock edge is to be sensed and cause said duty cycle controller to generate said memory control signals at said second node, third node and said SAE output node;

and further comprising driver means having an output coupled to said control terminal of said second electronically controlled switch, for selectively turning said second electronically controlled switch on when a transition of said clock signal is to be sensed, but for turning said second electronically controlled switch off when a voltage state or transition of said clock signal is to be ignored; and wherein said driver means further comprises power down means coupled to the control terminal of said second electronically controlled switch and to said first node, for receiving a power down signal having enable and disable binary states, and for controlling the voltage on said control terminal of said second electronically controlled switch and the voltage on said first node such that when said power down signal is in said disable binary state, said first node is forced to remain at a predetermined voltage and said second electronically controlled switch is rendered nonconductive between its first and second terminals such that said duty cycle controller is rendered inoperative regardless of any transitions of said clock signal, but for enabling said duty cycle controller to operate when said power down signal is in said enable state.

6. A process for controlling a static random access memory comprised of one or more memory cells, said memory having input latches for storing address bits, at least one input data bit and a write enable bit, said input latches having a transparent mode and a nontransparent mode, said memory also having bit lines and word lines and an address decoder, a Y multiplexer having inputs coupled to said bit lines and an output, at least one sense amplifier, data lines from the output of said Y multiplexer to the input of said sense amplifier, and an output node of said sense amplifier coupled by second data lines to the input of a data output latch, said process for generating control signals needed to control the memory in the proper sequence and with the proper timing to correctly operate the memory regardless of the duty cycle of a clock that defines the memory cycles, comprising:

sensing a clock transition from one binary logic state to the other binary logic state of a clock signal that marks the end of the setup time of a memory access cycle and changing the binary state of a first node from a first binary state to a second binary state so as to initiate a sequence of generating transitions in at least five signals in a predetermined sequence and spaced apart by predetermined delays;

generating a first transition from one binary logic state to the other in a first control signal, said first transition occurring a predetermined time after said clock transition and causing said input latches to go into transparent mode;

generating a second transition from one binary logic state to the other in a second control signal, said second transition occurring after a delay interval following said clock transition which is long enough to allow said data, address and write enable bits to have stabilized after said input latches have gone into not transparent mode and after said address decoder has activated the correct word line, said second transition occurring after said first transition and causing precharging of said bit lines and said data lines coupled to the input of said sense amplifier to cease;

generating a third transition from one binary logic state to the other in a third control signal, said third transition occurring after a delay interval following said second transition which is long enough so that after the bit lines and data lines have been released from precharging, the memory cell being read has had enough time to drive selected bit lines and the data lines running from the output of said Y multiplexer to the input of said sense amplifier to a high enough voltage swing for the sense amplifier to sense the bit stored in said memory cell, said third transition in said third control signal causing precharging of said output node of said sense amplifier and said second data lines to cease;

generating a fourth transition from one binary logic state to the other in a fourth control signal, said fourth transition occurring after a delay interval following said third transition which is long enough after cessation of precharging of said output node of said sense amplifier so as to to allow the sense amplifier to sense the voltage differential on the data lines from the output of the Y multiplexer and drive signals onto said second data lines to a sufficiently high voltage swing or differential which is sufficiently stable to be correctly latched into said data output latch, said fourth transition in said fourth control signal causing the data driven onto said second data lines to be latched into said data output latch; and generating a fifth transition in a fifth control signal which is coupled to said first node so as to cause said first node to transition back to said first binary state, said fifth transition occurring after a delay interval following said fourth transition which is long enough so as to establish the proper desired beginning time of a setup interval for the next memory access cycle and to initiate the process of precharging said bit lines and data lines and said output node of said sense amplifier and said second data lines.

7. The process of claim 6 wherein said fifth transition is generated at an early enough time to have precharging sufficiently complete before the end of the setup interval of the next memory cycle.

* * * * *